United States Patent
Jeon et al.

(10) Patent No.: US 6,399,491 B2
(45) Date of Patent: Jun. 4, 2002

(54) METHOD OF MANUFACTURING A BARRIER METAL LAYER USING ATOMIC LAYER DEPOSITION

(75) Inventors: In-sang Jeon, Suwon; Sang-bom Kang, Seoul; Hyun-seok Lim, Yongin; Gil-heyun Choi, Sungnam, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/826,946

(22) Filed: Apr. 6, 2001

(30) Foreign Application Priority Data

Apr. 20, 2000 (KR) .............................................. 00-20996

(51) Int. Cl.$^7$ ..................... H01L 21/44; H01L 21/4763; B05D 5/12
(52) U.S. Cl. ....................... 438/680; 438/643; 438/648; 438/653; 438/656; 438/685; 427/253; 427/255.2
(58) Field of Search ................................ 438/680, 681, 438/685, 642–643, 648, 652, 653, 761, 763; 427/250, 252, 253, 255.1, 255.2, 99

(56) References Cited

U.S. PATENT DOCUMENTS 6,197,683 B1 * 3/2001 Kang et al.
6,287,965 B1 * 9/2001 Kang et al. .................. 438/648
6,305,314 B1 * 10/2001 Sneh et al. ............. 118/723 R

OTHER PUBLICATIONS

Min et al, "Atomic layer deposition of TiN thin films by sequential introduction of Ti precursor and NH3", Mat. Ses. Soc. Symp. Proc. vol. 514, Materials Research Society 1998, pp. 337–342.*

Rital et al, "Atomic layer Epitaxy Growth of TiN thin films from TiI4 and NH3", J. Electrochem. Soc., Aug. 1998, vol. 145, No. 8, pp2914–2919.*

* cited by examiner

Primary Examiner—Olik Chaudhuri
Assistant Examiner—Thanhha Pham
(74) Attorney, Agent, or Firm—Volentine Francos, PLLC

(57) ABSTRACT

A method of manufacturing a barrier metal layer uses atomic layer deposition (ALD) as the mechanism for depositing the barrier metal. The method includes supplying a first source gas onto the entire surface of a semiconductor substrate in the form of a pulse, and supplying a second source gas, which reacts with the first source gas, onto the entire surface of the semiconductor substrate in the form of a pulse. In a first embodiment, the pulses overlap in time so that the second source gas reacts with part of the first source gas physically adsorbed at the surface of the semiconductor substrate to thereby form part of the barrier metal layer by chemical vapor deposition whereas another part of the second source gas reacts with the first source gas chemically adsorbed at the surface of the semiconductor substrate to thereby form part of the barrier metal layer by atomic layer deposition. Thus, the deposition rate is greater than if the barrier metal layer were only formed by ALD. In the second embodiment, an impurity-removing gas is used to remove impurities in the barrier metal layer. Thus, even if the gas supply scheme is set up to only use ALD in creating the barrier metal layer, the deposition rate can be increased without the usual accompanying increase in the impurity content of the barrier metal layer.

11 Claims, 3 Drawing Sheets

METHOD OF MANUFACTURING A BARRIER METAL LAYER USING ATOMIC LAYER DEPOSITION

BACKGROUND OF THE INVENTION

1. Field of the Invention

The present invention relates to a method of manufacturing semiconductor devices. More particularly, the present invention relates to a method of manufacturing a barrier metal layer using atomic layer deposition.

2. Description of the Related Art

In the manufacture of semiconductor devices, a barrier metal layer (for example, a TiN layer, a TaN layer, a WN layer) may be formed between adjacent material layers in order to prevent mutual diffusion or a chemical reaction from occurring between the adjacent material layers. For example, in the manufacture of a semiconductor memory device having a capacitor over bit-line (COB) structure, barrier metal layers are typically interposed between a lower electrode of a capacitor and a contact plug, between a dielectric layer of a capacitor and an upper electrode of the capacitor, between a conductive line and an insulating layer, and between a via contact and an insulating layer.

However, as the integration density of semiconductor devices increases, the topography of the surface on which a barrier metal layer is to be deposited becomes more rugged. When a barrier metal layer is formed on a rugged surface by a physical deposition process such as sputtering, the step coverage of the barrier metal layer is poor. Accordingly, a process providing excellent step coverage must be used to form a barrier metal layer on a deposition surface having a rugged topography. To this end, chemical vapor deposition (CVD) has been proposed. Hereinafter, a barrier metal layer formed by CVD will be referred to as a CVD barrier metal layer.

In the process of manufacturing a CVD barrier metal layer, a precursor including a halogen, such as Cl, is used as a typical metal source gas. The manufacturing process of a CVD barrier metal layer has an advantage in that the barrier metal is deposited rapidly, and a drawback in that the halogen of the precursor fails to fall out of the barrier metal layer and remains as an impurity within the barrier metal layer. The halogen remaining within the barrier metal layer as described above may cause an adjacent material layer (for example, an aluminum conductive line) to erode, and may increase the resistivity of the barrier metal layer. Thus, the amount of halogen remaining within the barrier metal layer must be reduced so as to decrease the resistivity of the barrier metal layer. In order to achieve this, the CVD barrier metal layer manufacturing process must be performed at a high temperature.

For example, in a CVD barrier metal layer manufacturing process using $TiCl_4$ as a metal source gas, a deposition temperature of at least 675° C. is required to obtain a resistivity of 200 $\mu\Omega$-cm or less. However, when a barrier metal layer is fabricated at a deposition temperature of 600° C. or greater, the thermal budget of an underlayer formed below the barrier metal layer is quite high, and secondary problems such as the generation of thermal stress are created. For instance, a CVD barrier metal layer must be formed over an Si contact or a via contact at a deposition temperature of 500° C. or less if the Si contact or via contact are not to be unduly thermally stressed. That is, the CVD barrier metal layer manufacturing process must be performed at a low temperature. A method of adding methylhydrazine (MH) to a metal source gas $TiCl_4$ can be used to facilitate the deposition of the barrier metal at a low temperature. However, this technique has a drawback in that the step coverage of the barrier metal layer is compromised.

The above-described problem of thermal stress, prevailing in the method of forming a CVD barrier metal layer manufacturing using a metal source gas such as $TiCl_4$ as a precursor, can be overcome by using an organometallic precursor such as tetrakis diethylamino Ti (TDEAT) or tetrakis dimethylamino Ti (TDMAT). That is, this so-called MOCVD barrier metal layer manufacturing process can be performed at a low temperature compared to the CVD barrier metal layer manufacturing process. However, a MOCVD barrier metal layer includes a large quantity of carbon impurities and therefore, exhibits a high resistivity. Also, the MOCVD barrier metal layer has worse step coverage than a barrier metal layer that is formed using a metal source gas such as $TiCl_4$ as a precursor.

Alternatively, the problems in the CVD barrier metal layer manufacturing process posed by using a metal source gas such as $TiCL_4$ as a precursor can be overcome by a technique of flushing the entire surface of a semiconductor substrate with an impurity-removing gas after the barrier metal layer is formed. However, the rate at which the impurity-removing gas must flow to flush the surface of the semiconductor substrate is several tens to several hundreds of times greater than that at which the reaction gas flows into the reaction chamber. Accordingly, this technique requires controlling the process conditions prevailing in the reaction chamber, such as the pressure of the chamber and the like. Effecting such a control takes time and thus, increases the total time of the manufacturing process.

Also, a method of forming a barrier metal layer using an atomic layer deposition (ALD) process has been used in an attempt to overcome the problems posed by the use of Cl in the CVD barrier metal layer manufacturing process. The conventional barrier metal layer forming method using ALD has an advantage in that it can be performed at a low temperature while minimizing the content of Cl in the barrier metal layer. However, the mechanism by which the barrier metal is deposited in ALD is chemical adsorption. Therefore, the conventional barrier metal layer forming method using ALD has a drawback in that the deposition rate is too slow for use in manufacturing semiconductor devices. As a comparison, the deposition rate of a typical CVD process used to form a TiN layer is approximately several hundreds of Å/min. On the other hand, the deposition rate at which a TiN layer can be formed using the conventional ALD process is less than 100 Å/min, which is very slow compared to when the CVD process is used.

SUMMARY OF THE INVENTION

A first object of the present invention is to provide a method of manufacturing a barrier metal layer that makes use of atomic layer deposition (ALD) but in which the deposition rate is not too slow.

A second object of the present invention is to provide a method of manufacturing a barrier metal layer using ALD, and by which the deposition rate at which the ALD occurs can be increased without an accompanying increase in the amount of impurities being left in the barrier metal layer.

To achieve the first above object, the present invention provides a method of manufacturing a barrier metal layer including: (a) supplying a first source gas onto the entire surface of a semiconductor substrate in the form of a pulse having a duration lasting from a point in time $A_1$ to a point in time $A_2$, and (b) supplying a second source gas, which reacts with the first source gas, onto the entire surface of the semiconductor substrate in the form of a pulse having a duration lasting from a point in time $A_3$ to a point in time $A_4$, wherein $A_3$ is at least as early in time as $A_1$ and no later in time than $A_2$. Preferably, point in time $A_4$ is no earlier than point in time $A_2$. Moreover, the points in time the pulse of the first source gas begins and ends can be the same as those at which the pulse of the second source gas begins and ends. That is, point in time $A_1$ can coincide with point in time $A_3$, and point in time $A_2$ can coincide with point in time $A_4$.

A purge gas can be used to discharge by-products of the reaction between the first and second source gases. The purge gas is supplied onto the entire surface of the semiconductor substrate beginning at a point in time that is earlier than or that coincides with point in time $A_1$. Alternatively, the purge gas can be supplied onto the entire surface of the semiconductor substrate beginning at a point in time that is later than point in time $A_4$ and is no later than point in time $A_3$.

An impurity-removing gas can be additionally used to free any impurities that have managed to become trapped within the barrier metal layer. In this case, the method includes a step (c) of supplying an impurity-removing gas onto the entire surface of the semiconductor substrate for a predetermined period of time, after point in time $A_4$ and while the purge gas is still being supplied.

The gas supply scheme comprising the steps (a), (b) and (c) constitutes a cycle of operation, and the cycle can be repeated at least once to increase the thickness of the barrier metal layer a desired amount.

The first source gas can include a gas of the halogen element family and a refractory metallic element, and the second source gas can include nitrogen. The purge gas can be an inert gas such as argon. The impurity removing gas can be $NH_3$.

To achieve the second object, the present invention provides a method of manufacturing a barrier metal layer, including: (a) supplying a first source gas onto the entire surface of a semiconductor substrate in the form of a pulse having a duration lasting from a point in time $B_1$ to a point in time $B_2$, (b) supplying a second source gas, which reacts with the first source gas, onto the entire surface of the semiconductor substrate in the form of a pulse having a duration lasting from a point in time $B_3$ to a point in time $B_4$, whereby a barrier metal layer is formed, and (c) supplying an impurity-removing gas onto the entire surface of the semiconductor substrate in the form of a pulse having a duration lasting from a point in time $B_5$ to a point in time $B_6$ to remove impurities from the barrier metal layer, wherein $B_3$ is later in time than $B_2$, and $B_5$ is later in time than $B_4$.

A purge gas can also be supplied onto the entire surface of the semiconductor substrate, beginning at a point in time that is earlier than or coincides with point in time $B_1$, or that is later than $B_1$ and no later than point in time $B_2$, to remove all of the first source gas that is physically adsorbed at the surface of the semiconductor substrate before the second source gas is supplied and/or to discharge by-products of the reaction between the first and second source gases.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

The preferred embodiments of the present invention will now be described in detail with reference to the attached drawings.

<First Embodiment>

In the first embodiment of a method of fabricating a barrier metal layer according to the present invention, first, a semiconductor substrate is loaded into a processing chamber of an ALD apparatus. The semiconductor substrate may have a feature having a predetermined aspect ratio. The feature may be a word line, a conductive line such as a bit line, a contact plug, a via contact, a capacitor upper electrode, or the like. After the semiconductor substrate is loaded into the processing chamber, first and second source gases and a purge gas are supplied to the chamber according to the scheme shown in FIG. 1 to form a barrier metal layer on a prescribed feature of the semiconductor substrate.

The barrier metal layer is typically formed of a binary or larger compound including a refractory metal and nitrogen. TiN is representative of the material of the barrier metal layer. Therefore, the first embodiment will be described in connection with the formation of a Ti-containing layer as a barrier metal layer.

Figure 1:
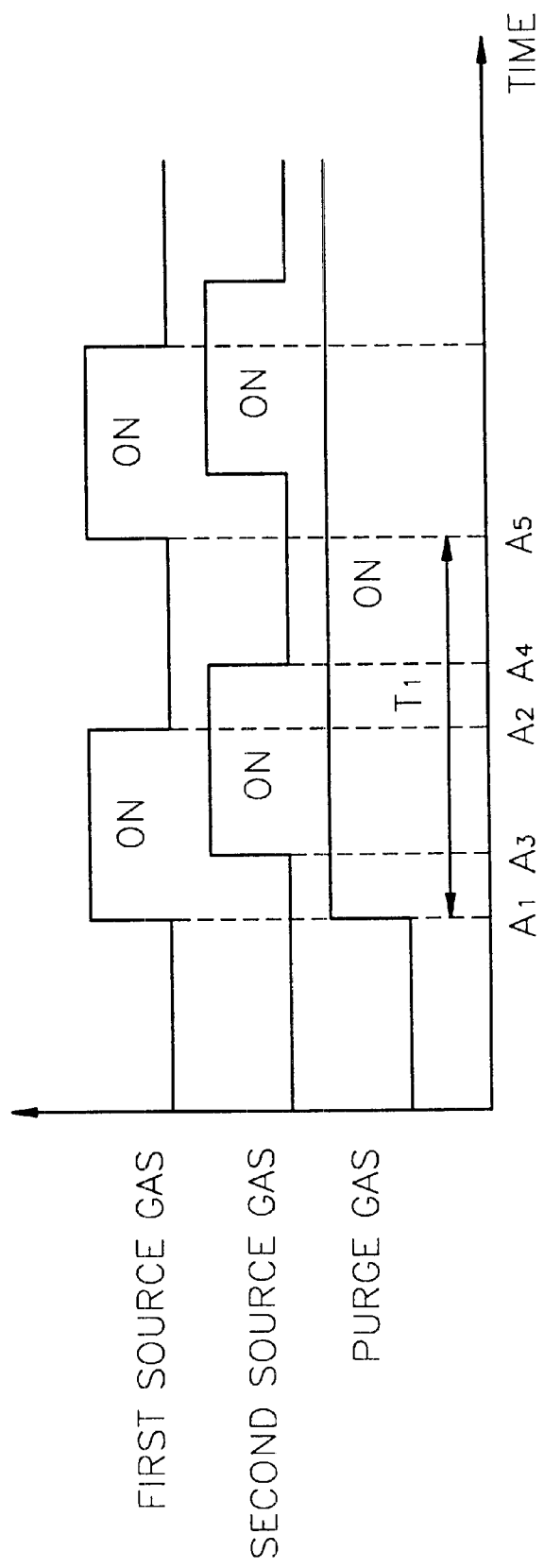
FIG. 1 is a timing diagram of the gas supply scheme of a first embodiment of a method of fabricating a barrier metal layer using atomic layer deposition (ALD) according to the present invention.

Referring now to FIG. 1, while a purge gas is continuously directed onto the entire surface of the semiconductor substrate, a first source gas is pulsed onto the surface of a semiconductor substrate for a duration lasting from a point in time $A_1$ to a point in time $A_2$. The pulse of the first source gas is chemically and physically adsorbed by the entire surface of the semiconductor substrate according to the surface topology thereof. However, some of the first source gas that has been physically adsorbed is then removed by the purge gas because the purge gas is being directed onto the entire surface of the semiconductor substrate while the first source gas is being physically adsorbed. The purge gas and the source gas entrained therein are discharged to the outside of the processing chamber.

Note, FIG. 1 shows that the continuous supplying of the purge gas is initiated at point in time $A_1$. However, the continuous supplying of the purge gas can be initiated before point in time $A_1$, or at a point in time $A_3$ that is as early as point in time $A_1$ but no later than point in time $A_2$. Also, the purge gas is an inert gas, such as argon.

On the other hand, a gas comprising a refractory metal (in this case, Ti) is used as the first source gas. For example, $TiCl_4$ is used as the first source gas. However, other source gases containing the barrier metal and capable of reacting with a second source gas can be used. For instance, considering the present example of a Ti-containing barrier metal layer, a metallo-organic gas such as tetrakis diethyl amino titanium (TDEAT) or tetrakis dimethyl amino titanium (TDMAT) can be used as the first source gas.

Next, a pulse of the second source gas is directed onto the surface of the semiconductor substrate for a duration lasting from point in time $A_3$ to a point in time $A_4$, and while the purge gas continues to be supplied onto the entire surface of the semiconductor substrate. Note, at point in time $A_3$ some of the first source gas is still being supplied and thus, not all of the first source gas physically adsorbed at the surface of the semiconductor substrate has been removed at this time by the purge gas. $A_4$ is a point in time that occurs no earlier than point in time $A_2$ but occurs some time after point in time $A_3$. Thus, the points in time under which the scheme of the gas supply is established are related as follows: ($A_1 \leq A_3 \leq A_2$, $A_2 \leq A_4$, $A_1 \neq A_2$, and $A_3 \neq A_4$). Under this scheme, point in time $A_1$ can coincide with point in time $A_3$, and point in time $A_2$ can coincide with point in time $A_4$, in which case the first and second source gases would be pulsed beginning at the same time and continuing for the same duration.

In any case, the pulsing of the second source gas is initiated before or at the same time the pulsing of the first source gas terminates. The pulse of the second source gas terminates after or at the same time the pulsing of the first source gas terminates. After the pulse of the second source gas terminates, only the purge gas is supplied along the entire surface of the semiconductor substrate for a duration lasting from point in time $A_4$ to a point in time $A_5$, thereby discharging by-products of the reaction of the first and second source gases.

A gas including a non-metallic element (N) of the barrier metal layer (TiN) is used as the second source gas. For example, $NH_3$ is used as the second source gas. However, other gases which react with the first source gas and contain nitrogen, such as $N_2$, can be used as the second source gas.

Now, in ALD, that part of the first source gas that has been chemically adsorbed reacts with the second source gas. However, from point in time $A_3$ to point in time $A_4$, i.e. the duration of the pulse of the second source gas, the mechanism by which the barrier metal (TiN) is deposited no longer consists of ALD because the first source gas physically adsorbed at the surface of the semiconductor substrate has not been completely removed by the purge gas. Accordingly, the second source gas reacts with not only that part of the first source gas that has been chemically adsorbed at the surface of the semiconductor substrate but also that part of the first source gas that has been physically adsorbed. Thus, although ALD results from the reaction between that part of the first source gas chemically adsorbed at the surface of the semiconductor substrate and the second source gas, CVD results from the reaction between that part of the first source gas physically adsorbed and the second source gas. Consequently, the ALD that takes place provides a 100% step coverage and the CVD that takes place provides a high deposition rate.

Moreover, as was described above, a large amount of impurities (Cl) are present in a barrier metal layer (TiN) when the barrier metal layer is formed by CVD. However, in the present invention, impurity-containing gases HCl and $TiCl_x$ generated as by-products are discharged from the processing chamber by flushing the entire surface of the semiconductor substrate with an inert gas while the first and second source gases react with each other ($A_3$–$A_4$) and for a predetermined period of time (that is, for a duration of $A_4$–$A_5$) after the pulse of the second source gas terminates. Consequently, impurities (Cl) are prevented from being entrapped within the deposited material. That is, even though the present invention employs the deposition mechanism of CVD, namely a process in which a high temperature is required to suppress the level of impurities in the barrier metal layer, the method of the present invention can be performed at a low temperature (for example, 450 to 500° C.) without producing a high level of impurities in the barrier metal layer because the present invention also employs ALD. Thus, the present invention also suppresses thermal stress and thereby decreases the thermal budget of the layer (underlayer) beneath the barrier metal layer.

In the first embodiment, the duration of $A_1$ to $A_5$ is a cycle $T_1$, and a barrier metal layer can be formed to a desired thickness by repeating the cycle $T_1$ a predetermined number of times. Also, the method can also comprise a step of pulsing an impurity-removing gas to further ensure that impurities (Cl) are prevented from being trapped within the barrier metal layer (TiN). The thickness of the TiN layer formed after one cycle is established by the process recipe under which the first and second source gases, and the purge gas (and impurity-removing gas) are supplied into the processing chamber.

Figure 2:
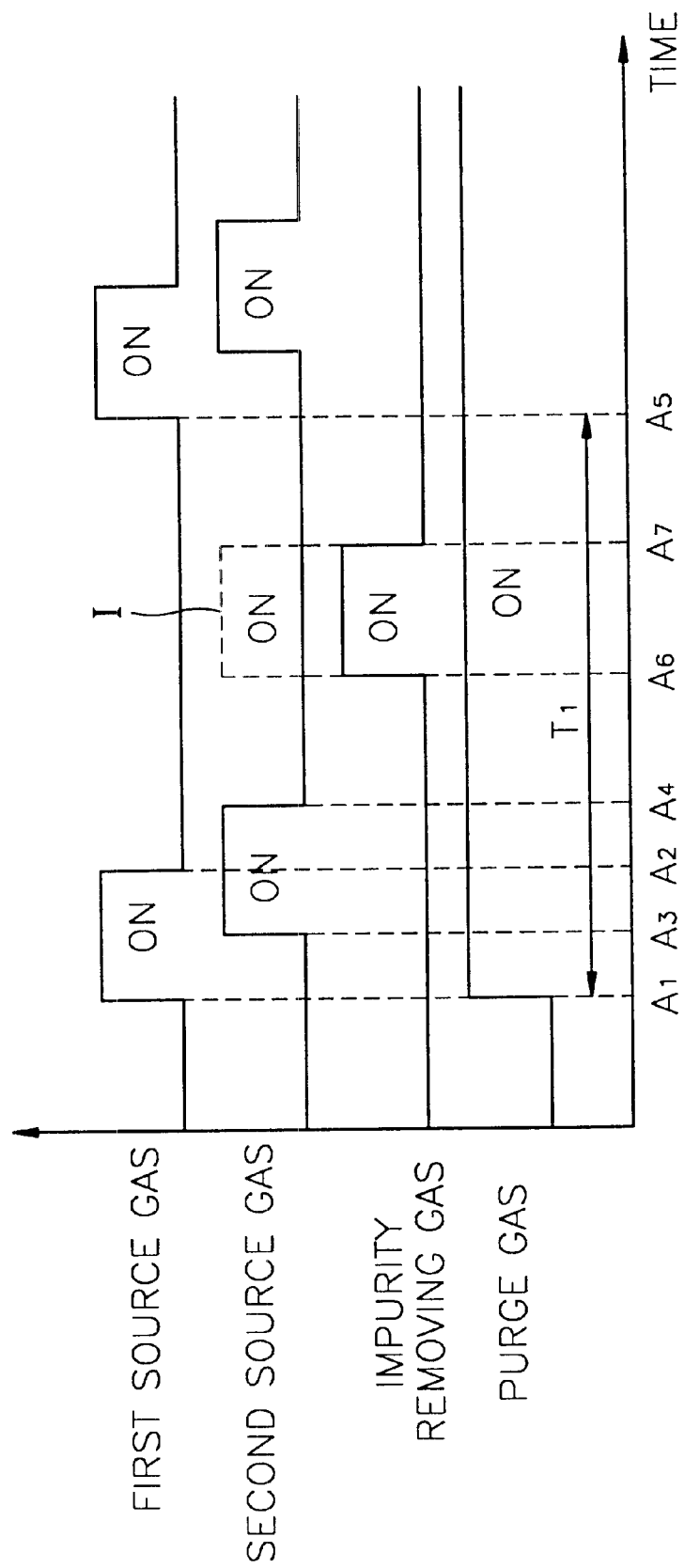
FIG. 2 is a timing diagram of an alternative gas supply scheme of the first embodiment of a method of fabricating a barrier metal layer using atomic layer deposition (ALD) according to the present invention.

As shown in FIG. 2, the impurity-removing gas can be supplied for a duration beginning at point in time $A_6$ and ending at point in time $A_7$, while the purge gas is being directed onto the surface of a semiconductor substrate and after the pulse of the second source gas terminates. The impurity-removing gas reacts with impurities trapped in the barrier metal layer during the reaction of the first and second source gases, and frees the impurities from the barrier metal layer. For example, the impurity-removing gas reduces the impurities to their constituent elements. Also, the impurity-removing gas can easily diffuse into the metal barrier layer and thereby react with the impurities because the thickness of the barrier metal layer formed during the time period from $A_1$ to $A_4$ is very thin (about 10 to 20 Å). Accordingly, in contrast with the conventional technique of flushing the barrier metal layer with an impurity-removing gas after the barrier metal layer has been completed, the technique of the present invention in which impurity-removing gas is supplied after one of a plurality of cycles can remove impurities (Cl) from the barrier metal layer using only a tiny flow of the impurity-removing gas.

$NH_3$ can be used as the impurity-removing gas. In this case, the processing apparatus does not need a separate gas supply line dedicated to the impurity-removing gas because the impurity-removing gas and the second source gas are the same. Rather, another pulse of the second source gas can be supplied from the time period $A_6$–$A_7$ (see reference character I). On the other hand, gases other than $NH_3$ can be used as the impurity-removing gas. In these cases, a separate gas supply line dedicated to the impurity-removing gas is required.

When the impurity-removing gas is $NH_3$, the impurity-removing gas diffuses into the barrier metal layer that was formed during the time period of from $A_1$ to $A_4$ and reacts with impurities (Cl) within the layer according to the following chemical equation, and frees the impurities (Cl) from the barrier metal layer in the form of gas (HCl).

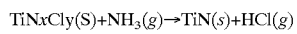  [Chemical equation]

<Second Embodiment>

Next, a second embodiment of a method of forming a barrier metal layer will be described. Like the first embodiment, the second embodiment of the present invention can also reduce the amount of impurities remaining in a barrier metal layer to a greater extent than the conventional ALD method without seriously compromising the deposition rate. For the sake of convenience, the second embodiment will also be described as applied to the forming of a TiN barrier metal layer.

Figure 3:
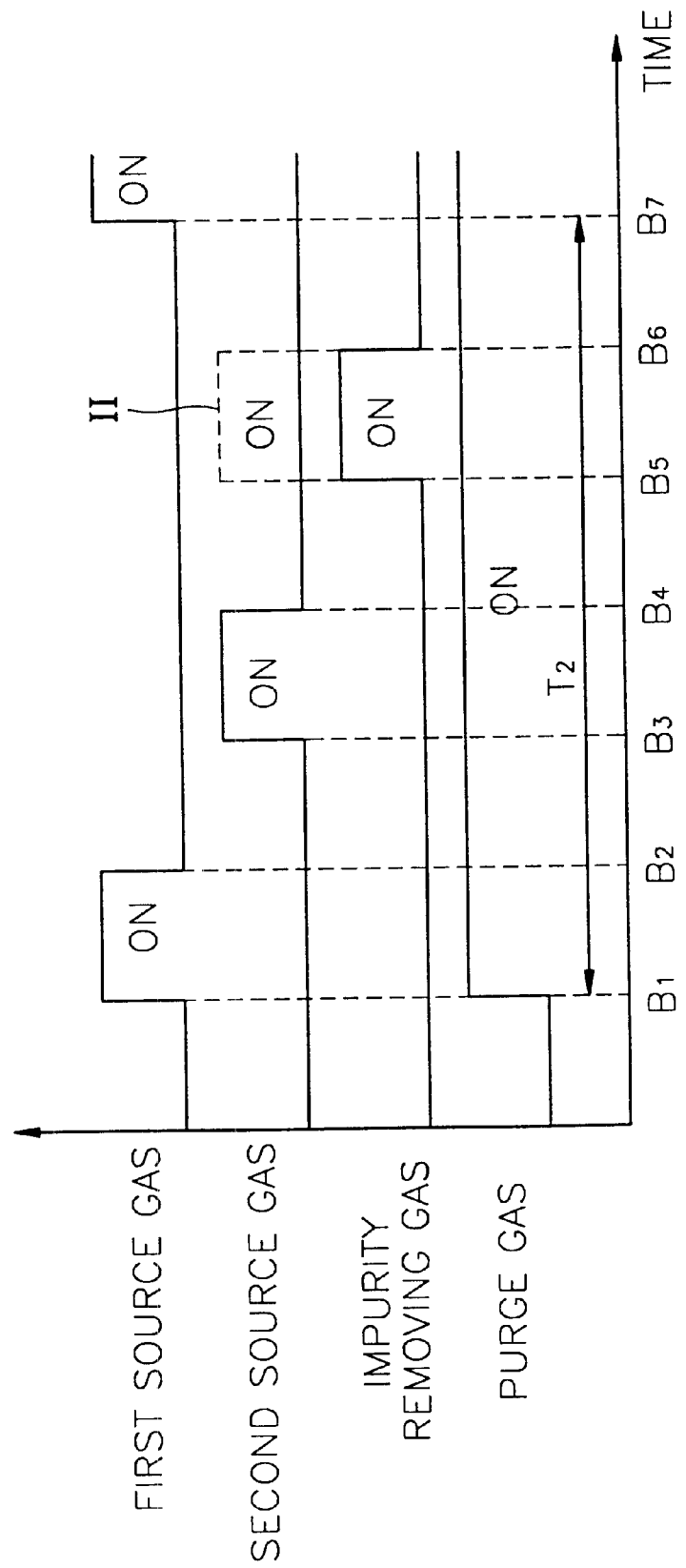
FIG. 3 is a timing diagram of the gas supply scheme of a second embodiment of a method of fabricating a barrier metal layer using atomic layer deposition (ALD) according to the present invention.

Referring to FIG. 3, in the second embodiment of the present invention, first, a semiconductor substrate is loaded into a processing chamber of an ALD apparatus. Next, a first source gas is supplied in the form of a pulse, beginning at a point in time $B_1$ and terminating at a point in time $B_2$, while a purge gas is being continuously supplied onto the entire surface of the semiconductor substrate. The first source gas is chemically and physically adsorbed at the surface of the semiconductor substrate according to the topology of the surface.

FIG. 3 shows that the flow of purge gas is initiated at the point in time $B_1$. However, the flow of the purge gas can be initiated prior to the point in time $B_1$, or from any point in time as early as $B_1$ and no later than $B_2$. Then, the physicallyadsorbed part of the first source gas is removed by the purge gas from the point in time $B_2$ to a point in time $B_3$. Thereafter, the second source gas is supplied in the form of a pulse beginning from the point in time $B_3$ and terminating at the point in time $B_4$ while the purge gas continuous to be supplied onto the entire surface of the semiconductor substrate. Then, from the point in time $B_4$ to a point in time $B_5$ only the purge gas is supplied, whereby by-products generated by the reaction of the first and second source gases are discharged from the chamber. Then, the impurity-removing gas is supplied in the form of a pulse beginning from the point in time $B_5$ and terminating at a point in time $B_6$ while the purge gas continuous to be supplied onto the entire surface of the semiconductor substrate. Note, the first and second source gases and the impurity-removing gas can be the same as those used in the first embodiment.

Also, similar to the first embodiment, the impurity-removing gas and the second source gas can be of the same type, whereby the processing apparatus does not require a separate gas supply line dedicated to the impurity-removing gas. That is, another pulse of the second source gas can be supplied during the time period of $B_5$–$B_6$ (see reference character II). On the other hand, when gases other than $NH_3$ are used as the impurity-removing gas, a separate gas supply line dedicated to the impurity-removing gas is required.

In this embodiment, impurities formed during the period of time from $B_1$ to $B_4$ are removed from the barrier metal layer by the impurity-removing gas. Thereafter, from the point in time $B_6$ to a point in time $B_7$, the purge gas discharges by-products of the reaction between the impurity-removing gas and the impurities.

The time period of $B_1$ to $B_7$ represents a cycle $T_2$, and the barrier metal layer can be formed to a desired thickness by repeating the cycle $T_2$. In the second embodiment, the impurity-removing gas is supplied after the supply of the second source gas is terminated, so that fewer impurities remain within the barrier metal layer than when the prior art method is used.

Consideration of the content of impurities within the barrier metal layer aside, the deposition rate of the barrier metal in ALD can be typically controlled by adjusting the process recipe under which the first and second source gases are supplied. That is, the deposition rate of the barrier metal can be increased by controlling the supply of the first and second source gases. However, increasing the deposition rate of the barrier metal in this way is normally accompanied by a corresponding increase in the amount of impurities within the barrier metal layer.

That is, there is a limit to ALD in changing the process recipe to increase the deposition rate of the barrier metal. However, in the second embodiment of the present invention, the use of the impurity-removing gas allows the process recipe under which the first and second source gases are supplied to be adjusted for increasing the deposition rate of the barrier metal without giving rise to a corresponding increase in the amount of impurities remaining within the barrier metal layer. In other words, the second embodiment provides a significant degree of freedom in adjusting the process recipe under which the first and second source gases are supplied.

A case in which the first and second embodiments of the present invention are applied to the manufacture of a binary barrier metal layer (TiN) will now be described in detail. However, the present invention is not limited to the manufacture of a TiN binary metal layer. Rather, the present invention is also applicable to the manufacture of other binary barrier metal layers such as a TaN layer, a WN layer, an AlN layer, a CrN layer and a BN layer. The type of first and second source gases and impurity-removing gas to be used when manufacturing barrier metal layers other than the TiN barrier layer will be readily apparent to those of ordinary skill in the art.

For example, when the barrier metal layer is formed of AlN, an $AlCl_x$ gas can be used as the first source gas, and $NH_3$ can be used as the second source gas and as the impurity-removing gas.

Also, the present invention is not applicable only to the manufacture of binary barrier metal layers, but can also be applied to the manufacture of barrier metal layers formed of larger compounds. For example, the present invention can also be applied to the manufacture of a TiBN layer, a TaBN layer, a TiAlN layer, a TaAlN layer, a TiSiN layer, a TaSiN layer, a TiCN layer, a WBN layer, and the like.

For example, when the barrier metal layer is formed of TiAlN using the first embodiment of the present invention, a first source gas (for example, $TiCl_4$), a second source gas (for example, trimethyl aluminum (TMA)) and a third source gas (for example, $NH_3$) can be supplied according to the following schemes. Note, in these schemes, the duration of the pulse of the first source gas is from a point in time $C_1$ to a point in time $C_2$, the duration of the pulse of the second source gas is from a point in time $C_3$ to a point in time $C_4$, and the duration of the pulse of the third source gas is from a point in time $C_5$ to a point in time $C_6$.

[first scheme]

$C_1 \leq C_3 \leq C_2$ and $C_1 \leq C_5 \leq C_2$

[second scheme]

$C_1 \leq C_3 \leq C_2$ and $C_3 \leq C_5 \leq C_4$

After the first through third source gases are supplied according to any one of the above schemes, the purge gas is directed onto the entire surface of the semiconductor substrate for a predetermined period of time, thereby completing the cycle. The cycle is repeated a predetermined number of times to form a barrier metal layer (TiAlN) having a desired thickness.

The barrier metal layer of TlAlN can also be formed using the second embodiment of the present invention, under the schemes set forth above. In this case, the deposition mechanism includes CVD along with ALD. Thus, the second embodiment will also exhibit a higher deposition rate than the prior art. Also, the purge gas is continuously supplied onto the entire surface of the semiconductor substrate while the source gases are being supplied. Thus, the amount of impurities remaining within the barrier metal layer are minimal even though the process is carried at a temperature as low as that used to carry out the conventional ALD process. Furthermore, in the second embodiment, an impurity-removing gas can be supplied in the form of a pulse after the first through third source gases are suppled, as in the first embodiment, thereby reducing the amount of impurities within the barrier metal layer.

According to one aspect of the present invention, the barrier metal layer is formed by ALD and CVD, so that the deposition rate of the barrier metal is greater than if the barrier metal layer were formed only through ALD. Also, a purge gas is continuously supplied onto the entire surface of the semiconductor substrate during the manufacture of the barrier metal layer, so that the amount of impurities remaining within the barrier metal layer is minimized despite the fact that the method is carried out at a low temperature suitable for ALD.

According to another aspect of the present invention, the barrier metal layer is formed only through ALD. However, an impurity-removing gas is supplied during the process to free impurities that have been trapped in the barrier metal layer. Therefore, the process recipe for the source gases has a high degree of freedom, can be changed to a great extent to increase the deposition rate of the barrier metal. Therefore, even though the barrier metal layer is formed only through ALD, the barrier metal can be deposited at higher and higher rates without corresponding increases in the impurity content of the barrier metal layer.

Although the present invention has been described with reference to the preferred embodiments thereof, various modifications thereof will be apparent to those of ordinary skill in the art. All such modifications are seen to be within the true spirit and scope of the invention as defined by the appended claims.

What is claimed is:

1. A method of manufacturing a barrier metal layer, comprising the steps of:

loading a semiconductor substrate into a processing chamber;

supplying a first source gas, containing a metal, onto the entire surface of the semiconductor substrate in the form of a pulse having a duration lasting from a point in time $A_1$ to a point in time $A_2$, whereby the first source gas is chemically and physically adsorbed at the surface of the semiconductor device; and supplying a second source gas, that is reactive with the first source gas to form the barrier metal, onto the entire surface of the semiconductor substrate in the form of a pulse having a duration lasting from a point in time $A_3$ to a point in time $A_4$, wherein said point in time $A_3$ is no earlier than said point in time $A_1$ and no later than said point in time $A_2$, whereby one portion of the second source gas reacts with that part of the first source gas physically adsorbed at the surface of the semiconductor substrate to thereby form the barrier metal layer by chemical vapor deposition whereas another part of the second source gas reacts with that part of the first source gas chemically adsorbed at the surface of the semiconductor substrate to thereby form the barrier metal layer by atomic layer deposition.

2. The method of claim 1, wherein said point in time $A_4$ is no later in time than said point in time $A_2$.

3. The method of claim 1, and further comprising supplying a purge gas onto the entire surface of the semiconductor substrate beginning at a point in time that is no later than said point in time $A_1$.

4. The method of claim 1, and further comprising supplying a purge gas onto the entire surface of the semiconductor substrate beginning at a point in time that is later than said point in time $A_1$ and no later than said point in time $A_3$.

5. The method of claim 1, wherein the first source gas includes an element of the halogen family and a refractory metal, and the second source gas includes nitrogen.

6. The method of claim 1, and further comprising supplying a purge gas onto the entire surface of the semiconductor substrate for period of time after said point in time $A_4$ to discharge by-products of the reaction between the first and second source gases.

7. The method of claim 6, wherein said steps of supplying the first source gas in the form of a pulse, supplying the second source gas in the form of a pulse, and supplying the purge gas for a period of time are repeated at least once to increase the thickness of the barrier metal layer.

8. The method of claim 1, wherein the reaction of the first and second source gases produces an impurity trapped in the barrier metal layer, and further comprising supplying a purge gas onto the entire surface of the semiconductor substrate, and supplying an impurity-removing gas, capable of reacting with the impurity, onto the entire surface of the semiconductor substrate for a period of time beginning after point in time $A_4$ and while the purge gas is being supplied, in order to remove impurities from the barrier metal layer.

9. The method of claim 8, wherein the impurity removing-gas is $NH_3$.

10. The method of claim 8, wherein said steps of supplying the first source gas in the form of a pulse, supplying the second source gas in the form of a pulse, and supplying the impurity-removing gas are repeated at least once to increase the thickness of the barrier metal layer.

11. The method of claim 1, wherein said point in time $A_1$ coincides with said point in time $A_3$, and said point in time $A_2$ coincides with said point in time $A_4$.

* * * * *